United States Patent [19]

Ferrer et al.

[11] Patent Number: 5,672,999
[45] Date of Patent: Sep. 30, 1997

[54] AUDIO AMPLIFIER CLIPPING AVOIDANCE METHOD AND APPARATUS

[75] Inventors: Enrique Ferrer, Miami, Fla.; Kenneth A. Hansen, Round Rock, Tex.

[73] Assignee: Motorola, Inc., Schaumburg, Ill.

[21] Appl. No.: 586,536

[22] Filed: Jan. 16, 1996

[51] Int. Cl.$^6$ .................................................. H03G 3/20
[52] U.S. Cl. ...................... 330/138; 330/279; 330/280; 381/107
[58] Field of Search ............................ 330/2, 129, 138, 330/149, 279, 280; 381/107; 455/250.1

[56] References Cited

U.S. PATENT DOCUMENTS

| | | | |
|---|---|---|---|
| 4,398,061 | 8/1983 | McMann, Jr. ............... | 381/107 X |
| 4,978,926 | 12/1990 | Zerod et al. ............... | 455/250.1 |
| 5,430,409 | 7/1995 | Buck et al. ............... | 330/2 |
| 5,442,316 | 8/1995 | Buck et al. ............... | 330/2 |
| 5,453,716 | 9/1995 | Person et al. ............... | 330/2 |

*Primary Examiner*—James B. Mullins
*Attorney, Agent, or Firm*—Andrew S. Fuller

[57] ABSTRACT

An audio amplifier clipping avoidance apparatus (140) identifies signal segments of an audio signal that can have an amplitude peak greater than a particular amplifier clip avoidance threshold (530). A scaling factor is determined for each signal segment based on the particular threshold (540). Signal segments are scaled with corresponding scaling factors to produce a modified audio signal having no signal segments with an amplitude peak greater than the particular threshold (560).

9 Claims, 7 Drawing Sheets

5,672,999

AUDIO AMPLIFIER CLIPPING AVOIDANCE METHOD AND APPARATUS

TECHNICAL FIELD

This invention relates in general to the processing of audio signals, and more particularly, audio processing for amplifier clip avoidance.

BACKGROUND

Electronic devices having an audio output often include a power amplifier to amplify audio signals. It is generally known that audio output quality can be significantly affected by clipping at the audio amplifier. Clipping occurs when the audio amplifier's dynamic range is exceeded. In such cases, the amplifier's output is unable to follow the dynamics of an input signal linearly, and the resultant output signal is clipped. Consequently, the output signal is distorted. In a typical example, the output from an audio amplifier is controlled using a volume control mechanism that sets amplifier gain. A volume control setting above the rated audio of the amplifier generally results in clipping of the output signal.

The prior art teaches a number of methods for addressing the problem of amplifier clipping. Generally, the presence of amplifier clipping is detected and some adjustment made to the amplifier, or to the input signal of the amplifier, to avoid clipping at the output. One such method is described in U.S. Pat. No. 5,442,316 issued to Buck et al., on Aug. 15, 1995, for a Temperature Compensated and Supply Independent Clipping Distortion Indicator. In this example, a clipping distortion detect signal is outputted that is used to adjust the amplifier to bring distortion within an acceptable amount. Adjustments are made by reducing the level of the input signal or the gain of the amplifier.

Another prior art system is described in U.S. Pat. No. 5,453,716, issued to Person et al., on Sep. 26, 1995, for an Adjustable Clip Detection System. Here, a clip detection system monitors the audio output from an amplifier for clipping distortion. When clipping is detected, the microprocessor signals a volume control circuit to decrease the voltage level of the audio output until clipping is no longer detected.

The prior art approaches described permit some level of clipping to be detected by a listener. Moreover, adjustments made to compensate for clipping may affect a substantial portion of the output signal. For example, a user may notice a significant reduction in the level of the outputted audio.

It is desirable to provide audio output without the audio quality degradation that occurs from amplifier clipping. Preferably, such amplifier clipping avoidance is provided without a substantial reduction in the overall level of the audio output. The prior art does not adequately address these needs. Hence, an improved method and apparatus for amplifier clip avoidance is required.

DETAILED DESCRIPTION OF THE PREFERRED EMBODIMENT

Figure 1:
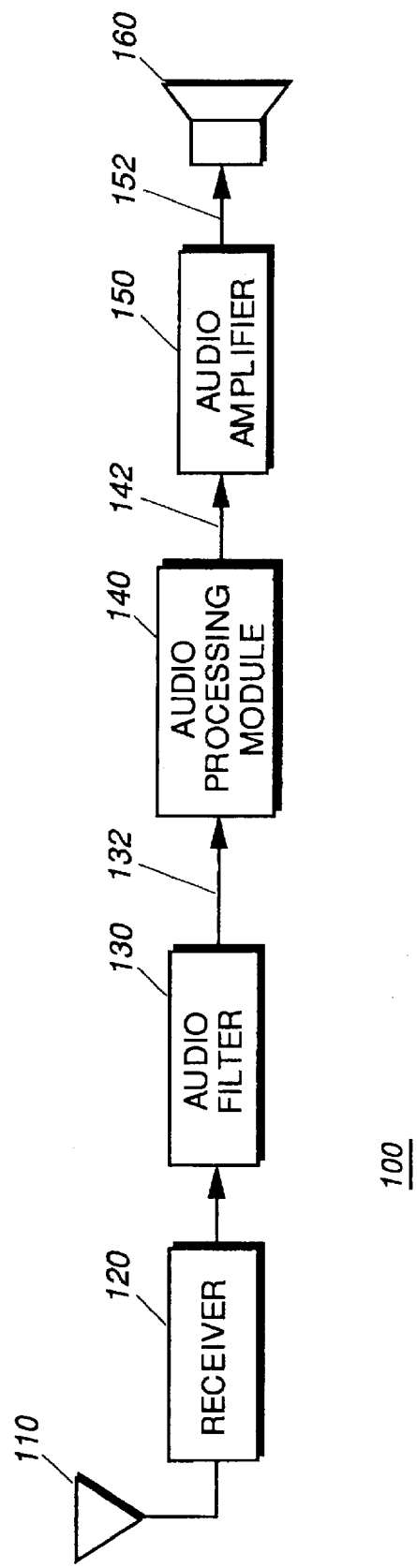
FIG. 1 is a block diagram of a communication device having audio signals processed by an audio processing module, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides a method and apparatus for clip avoidance at the output of an audio power amplifier. Amplifier clipping is avoided by preferably controlling the input signal to the audio power amplifier. The level of the input audio signal beyond which amplifier clipping will occur is identified, and this signal level used as an amplifier clip avoidance threshold. Segments of the input audio signal are identified that can have an amplitude peak greater than the clip avoidance threshold. Preferably, these signal segments correspond to half cycles of the audio signal. A scaling factor is determined for each signal segment based on the clip avoidance threshold and the peak amplitude or signal level of the audio signal within a particular signal segment. Each signal segment is modified with a corresponding scaling factor when the signal segment has an amplitude peak greater than the clip avoidance threshold. Accordingly, each signal segment is scaled to produce a modified audio signal having no signal segments with an amplitude peak greater than the clip avoidance threshold.

FIG. 1 is a block diagram of a radio 100 having an audio output, in accordance with the present invention. The radio 100 is an electronic communication device capable of receiving radio frequency (RF) signals and transforming them into audio output using well known principles. The radio 100 receives RF signals through an antenna 110. These RF signals are processed by a receiver 120. An audio filter 130, coupled to the receiver 120, provides an audio processing module 140 with an audio signal 132. The audio processing module 140 processes the audio signal 132 to provide a modified audio signal 142 for input to an audio amplifier 150. The audio amplifier 150 amplifies the modified audio signal 142 to generate an amplified signal 152 that drives a speaker 160.

According to the present invention, the audio processing module 140 ensures that the modified audio signal 142 does not result in amplifier clipping at the output of the audio amplifier 150. Preferably, the audio signal 132 is selectively modified using digital signal processing techniques. In the preferred embodiment, the audio signal 132 is segmented and scaled as necessary to prevent the signal 152 at the power amplifier output from going into clip, without substantially reducing the overall level of the output signal.

Figure 2:
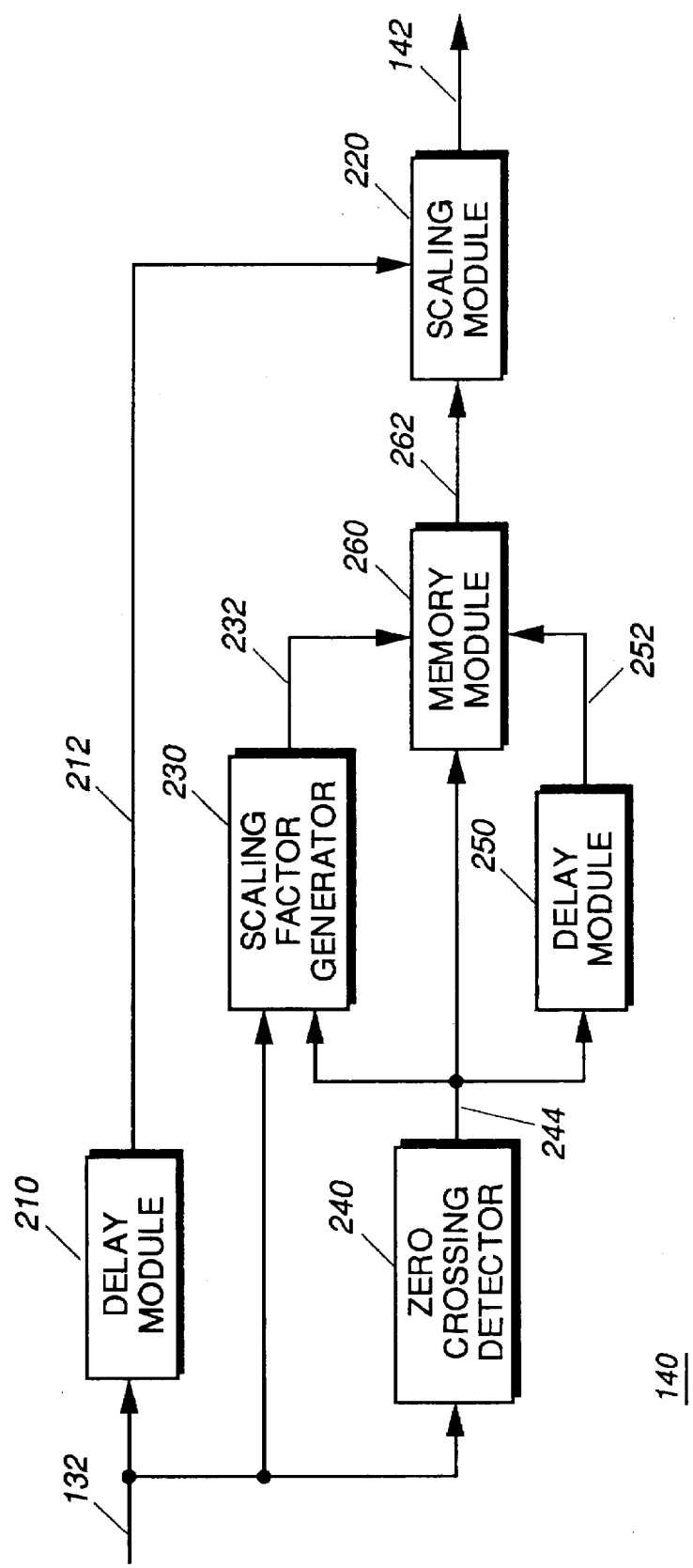
FIG. 2 is a block diagram of the audio processing module of FIG. 1, including a scaling factor generator and memory module, in accordance with the present invention.

FIG. 2 is a block diagram of the audio processing module 140, in accordance with the present invention. The functional components of the audio processing module 140 include a scaling factor generator 230, a zero crossing detector 240, a memory module 260, delay modules 210, 250, and a scaling module 220. These functional components are preferably selectively implemented in a digital signal processor (DSP), using custom integrated circuitry, or software. Although depicted as specific functional blocks, the functions or modules may be combined or otherwise distributed to implement the concepts represented.

As stated earlier, the audio processing module 140 receives an audio signal 132 for processing. The delay module 210 is coupled to the audio signal 132, and has an output of a delayed audio signal 212. The delayed audio signal 212 has a delay preferably based upon the frequency of the audio signal 132. In the preferred embodiment the delay directly corresponds to the lowest frequency of the audio signal expected at audio processing module 140. The zero crossing detector 240 is coupled to the audio signal 132. The zero crossing detector 240 outputs a transition signal 244 identifying segments of the audio signal 132 that can have an amplitude peak greater than a particular amplitude threshold. The transition signal 244 preferably comprises a set of pulses generated to correspond with each half cycle of the audio signal. The half cycle is defined as the portion of signal between successive crossing of a particular signal level threshold, which in the preferred embodiment represents the zero voltage level. Preferably, each half cycle or identified signal segment is processed individually to minimize impact on the overall amplitude or level of the audio signal, and to minimize impact on the signal quality. A second delay module 250 is coupled to the transition signal 244. The second delay module 250 outputs a delayed transition signal 252 having the same delay as that of the delayed audio signal 212.

The scaling factor generator 230 is coupled to the audio signal 132 and to the transition signal 244. The scaling factor generator 230 generates a scaling factor for an identified segment or half cycle of the audio signal based on the amplifier clip avoidance threshold, and based on peak amplitude of the audio signal within each identified signal segment. In the preferred embodiment, the scaling factor generator 230 produces a scaling factor for each segment of the audio signal, that corresponds to the ratio of the amplifier clip avoidance threshold and the peak amplitude, when the peak amplitude is greater than the amplifier clip avoidance threshold.

Figure 3:
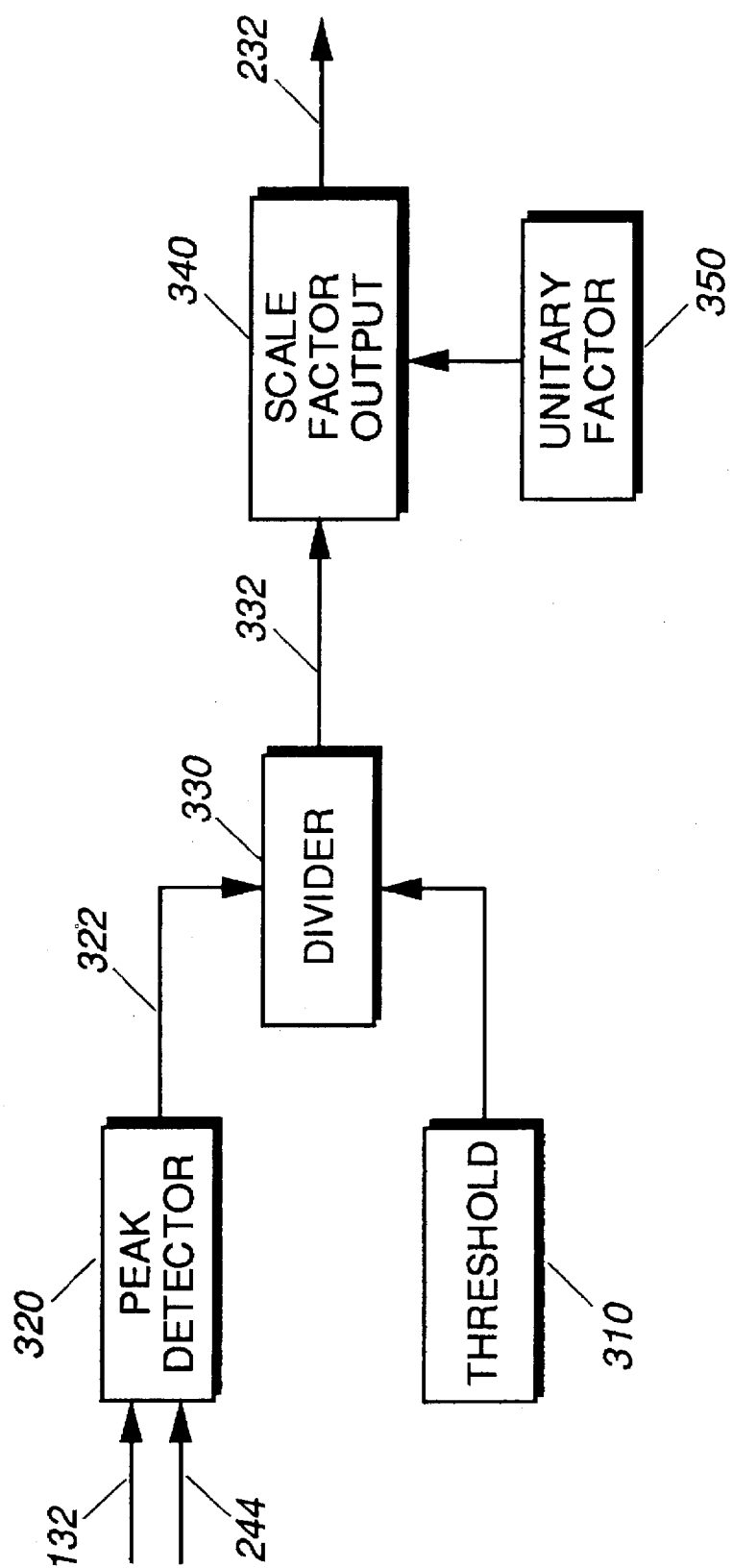
FIG. 3 is a block diagram of the scaling factor generator of FIG. 2, in accordance with the present invention.

FIG. 3 is a block diagram highlighting components of the scaling factor generator 230, in accordance with the present invention. Referring to FIGS. 2 and 3, the scaling factor generator 230 includes a peak detector 320, that is coupled to the audio signal 132 and the transition signal 244. The peak detector 320 determines the peak amplitude of the audio signal between successive zero crossings. The peak amplitude is determined by successively sampling the audio signal and storing the highest (absolute value) amplitude detected within a particular signal segment. Preferably, the audio signal is full wave rectified before sampling occurs. A divider 330, coupled to the peak detector 320, computes a value 332 corresponding to the ratio of the amplifier clip avoidance threshold 310 to the peak amplitude 322. A scale factor output module 340 outputs a scaling factor signal 232 of a unitary factor 350, i.e., a scaling factor of one, when the peak amplitude of the audio signal is not greater than the clip avoidance threshold. When the peak amplitude of the audio signal is greater than the amplifier clip avoidance threshold, the scaling factor output module outputs a scaling factor signal 232 corresponding to the ratio 322 of the amplifier clip avoidance threshold and the peak amplitude.

Figure 4:
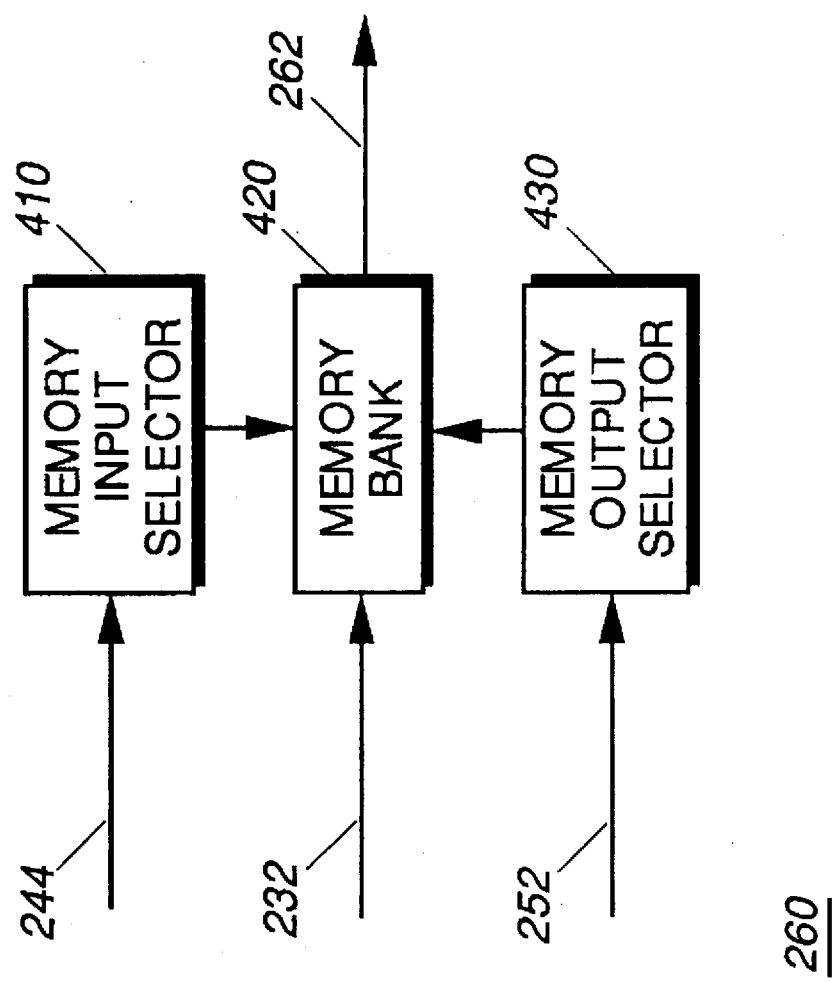
FIG. 4 is a block diagram of the memory module of FIG. 2, in accordance with the present invention.

The memory module 260 is coupled to the scaling factor signal 232, to the transition signal 244, and to the delayed transition signal 252. The memory module is responsive to the pulses of the transition signal to store each scaling factor, and is responsive to the pulses of the delayed transition signal to output each stored scaling factor. FIG. 4 is a block diagram of the memory module 260, in accordance with the present invention.

Referring to FIGS. 2 and 4, the memory module 260 includes a memory input selector 410, a memory bank 420, and a memory output selector 430. In the preferred embodiment the memory bank comprises a set of storage locations capable of storing the scaling factor. The memory input selector 410 is coupled to the memory bank 420 and to the transition signal 244. The memory input selector 410 determines the storage location in the memory bank 420 that receives a particular scaling factor. Upon each pulse of the transition signal 244, indicating a zero crossing or end of a signal segment, the memory input selector 410 selects, in sequence, a successive memory bank storage location. The memory bank 420 is coupled to the scaling factor signal 232, and stores the scaling factor in the current storage location as determined by the memory input selector 410. The memory output selector 430 is coupled to the delayed transition signal 252. Upon each pulse of the delayed transition signal 252, indicating a zero crossing or new signal segment of the delayed audio signal 212, the memory output selector 430 selects, in sequence, a successive memory bank storage location from which the stored scaling factor 262 is outputted.

The scaling module 220 is coupled to the delay module 210 and to the memory module 260. Accordingly, the scaling module 220 is responsive to the delayed audio signal 212 and to the stored scaling factor 262 to produce a modified audio signal 142 having no signal segments with an amplitude peak greater than the amplifier clip avoidance threshold. The scaling module combines the identified segments of the audio signal with corresponding scaling factors to produce the modified audio signal. In the preferred embodiment, the scaling module is implemented as a multiplier that applies the scaling factor to the delayed audio signal 212. The selection of scaling factor is governed by the delayed transition signal 252 and therefore corresponds directly with the delayed audio signal 212 such that the correct scaling factor 262 is applied to a particular segment of the audio signal.

Figure 5:
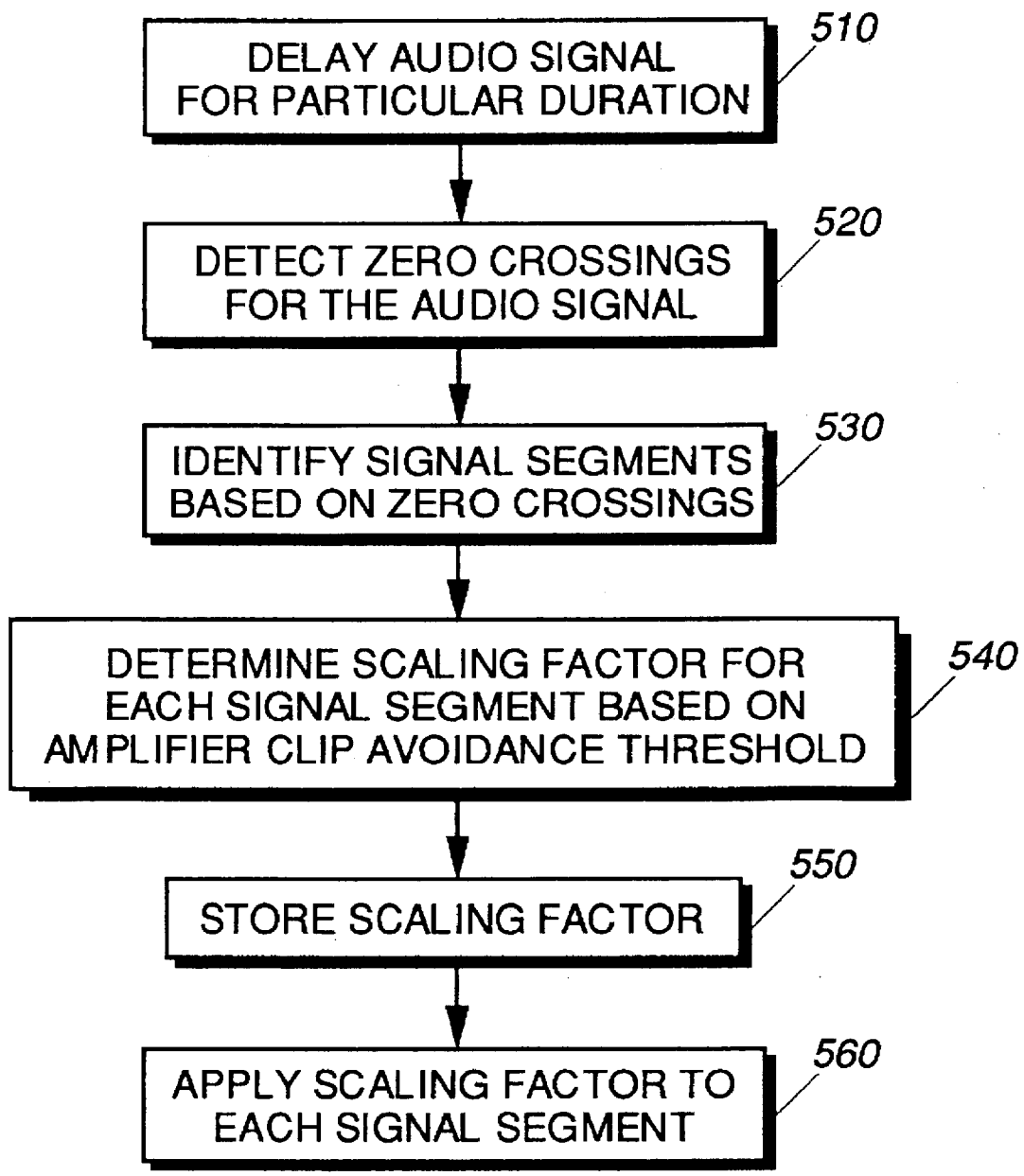
FIG. 5 is a flowchart of procedures for processing audio signals to avoid amplifier clipping, in accordance with the present invention.

FIG. 5 is a flowchart of procedures 500 used by the audio processing module 140 to generate the modified audio signal 142, in accordance with the present invention. In the preferred embodiment, the audio signal represents received communication signals to be outputted as audio in real time or near real time. Scaling factors are calculated for application to identified segments of the audio signal than can have an amplitude peak greater than an amplifier clip avoidance amplitude threshold.

To provide sufficient time for calculating the scaling factor, the audio signal is delayed for a particular duration, step 510. The delay period is based on a minimum expected frequency of the audio signal. Zero crossings are detected for the audio signal, step 520, and the audio signal segmented based on the detected zero crossings, step 530. A zero crossing is detected when the audio signal transitions across a zero volts signal level, and the boundaries for half cycles of the audio signal are established based on successive zero crossings. A scaling factor is determined for each signal segment based on the amplifier clip avoidance threshold, and the peak amplitude of the audio signal within the particular signal segment, step 540. The scaling factor determined for each signal segment is stored during the particular duration of the audio signal delay, step 550. Each signal segment is scaled with a corresponding scaling factor to produce a modified audio signal having no signal segments with an amplitude peak greater than the particular amplitude threshold, step 560. Accordingly, each signal segment is modified with the scaling factor when the audio signal has an amplitude peak greater than the amplifier peak avoidance threshold. The scaling factor for each signal segment is applied to the delayed audio signal, i.e., to the audio signal after the particular delay period.

Figure 6:
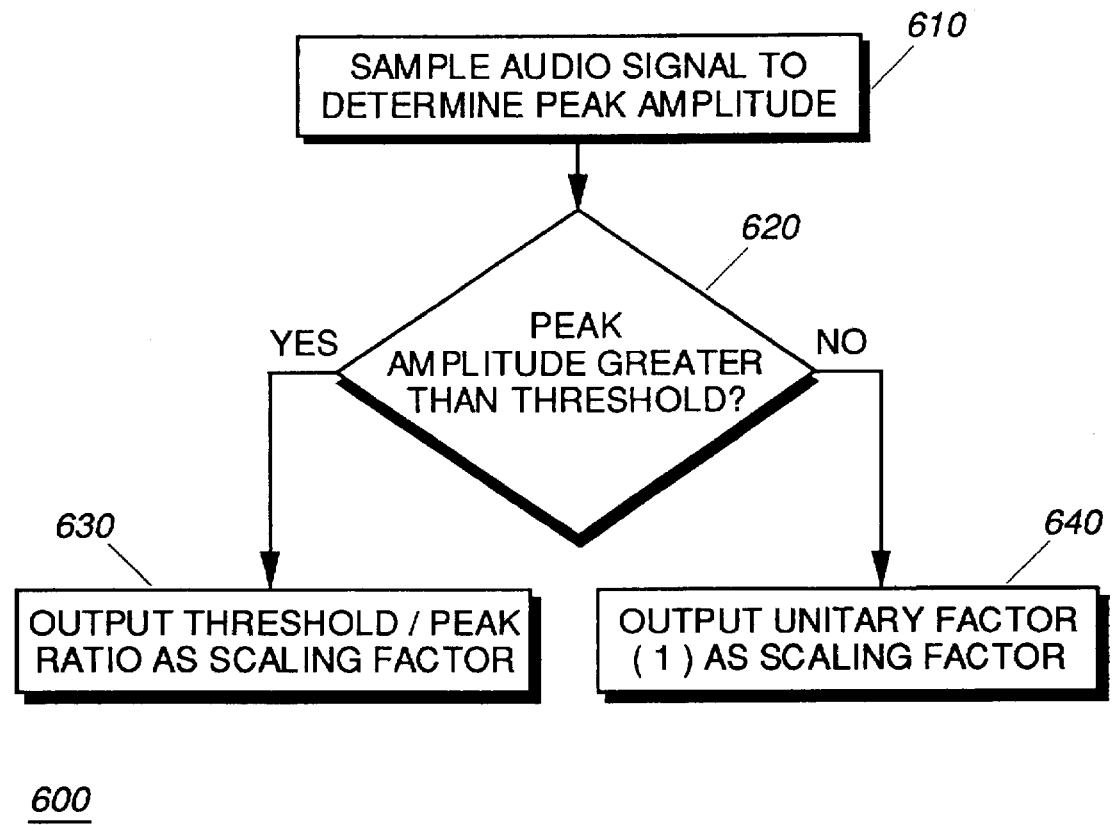
FIG. 6 is a flowchart of procedures used in determining a scaling factor, in accordance with the present invention.

FIG. 6 is a flowchart of procedures 600 for determining a scaling factor, in accordance with the present invention. The audio signal is repeatedly sampled, during a particular signal segment of half cycle, to determine peak amplitude, step 610. When the peak amplitude is greater than the amplifier clip avoidance threshold, a scaling factor corresponding to a ratio of the clip avoidance threshold and the peak amplitude is outputted, steps 620, 630. When the peak amplitude is less than the amplifier clip avoidance threshold, a unitary factor, i.e., a scaling factor of one is outputted, steps 620, 640.

Figure 7:
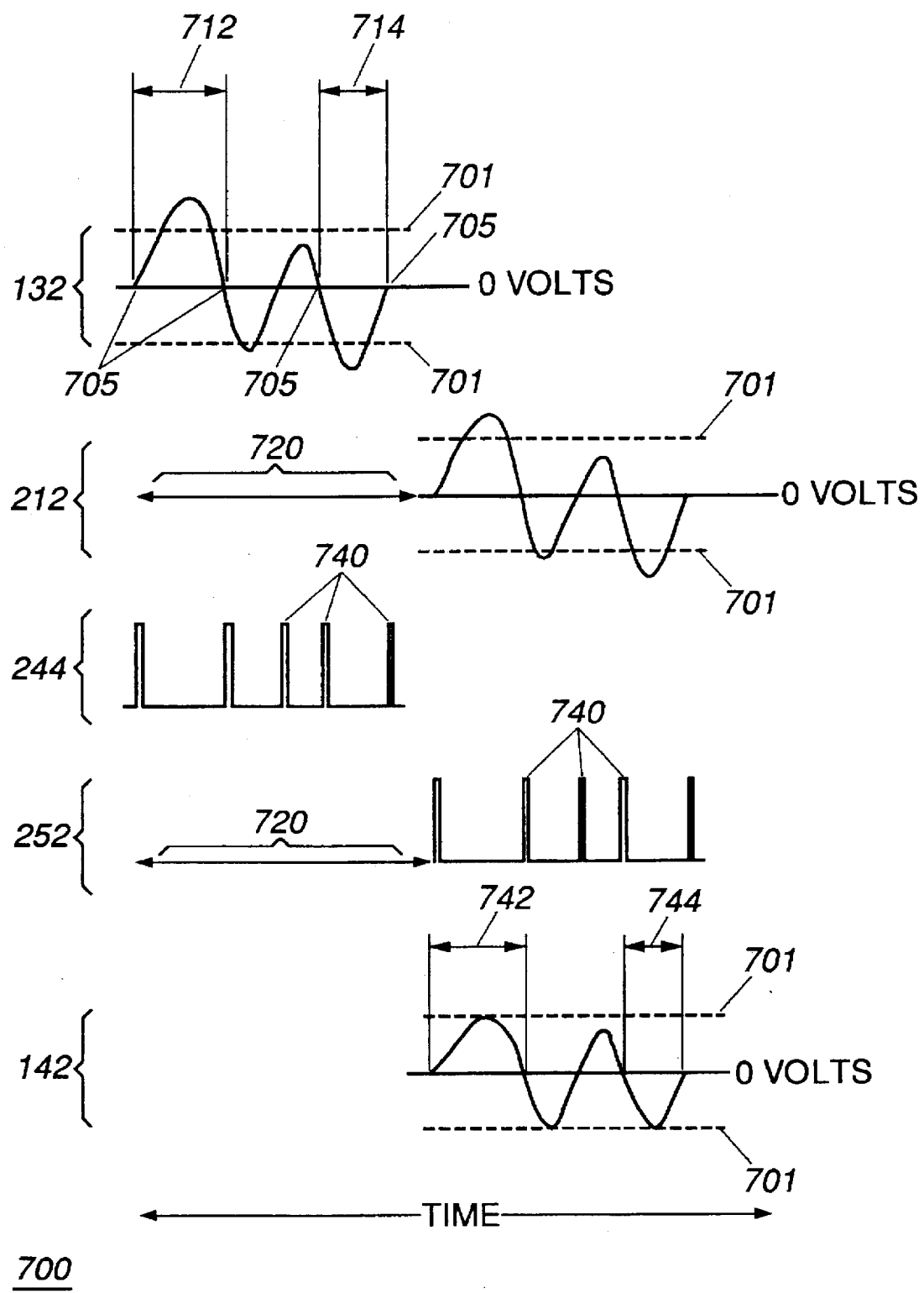
FIG. 7 is a timing diagram of various signals during audio signal processing, in accordance with the present invention.

FIG. 7 is a timing diagram 700 illustrating the signals at various points in the audio processing module 140 of the preferred embodiment. Referring to FIGS. 2 and 7, the audio signal 132 is shown having signal segments 712, 714 having amplitude peaks exceeding the amplifier clip avoidance threshold 701. The audio signal 132 is also shown to have zero crossings 705 at each point where the signal transitions across zero volts. The delayed audio signal 212 is shown having a particular delay 720. The output of the zero crossing detector, i.e., the transition signal 244, is shown as a pulse 740 at each zero crossing 705 of the audio signal. The delayed transition signal also has the particular delay 720. The modified audio signal 142 is generated by applying the scaling factor to the portion of the audio signal between each zero crossing. Note that the scaled portions 742, 744 of the modified audio signal 142 are those corresponding to signal segments 712, 714 of the audio signal 132 having amplitude peaks greater than the amplifier clip avoidance threshold. The remainder of the modified audio signal is the same as the original audio signal 132. Accordingly, signal distortion is minimized.

The present invention provides significant benefits over the prior art. Amplifier clipping is avoided with minimal impact on the quality of the amplified audio signal. As modification of the audio signal is limited to only those signal segments having the potential of causing the amplifier to clip, the impact on the overall signal level of the amplified signal is limited. The concepts of the present invention are also applicable for processing signals other than audio amplifier input signals to avoid amplifier clipping, such as in other power amplifier applications.

What is claimed is:

1. A method of processing an audio signal, comprising the steps of:

identifying signal segments of the audio signal that can have an amplitude peak greater than a particular amplitude threshold, including the steps of:
  detecting zero crossings for the audio signal; and
  segmenting the audio signal based on detected zero crossings;

storing information identifying the zero crossings for the audio signal;

determining a scaling factor for each signal segment based on the particular amplitude threshold; and scaling each signal segment with a corresponding scaling factor to produce a modified audio signal having no signal segments with an amplitude peak greater than the particular amplitude threshold, including the steps of:

delaying each signal segment for a particular delay period;

storing the scaling factor for each signal segment during the particular delay period; and applying the scaling factor for each signal segment after the particular delay period, by using the stored information that identify the zero crossings.

2. The method of claim 1, wherein the particular delay period is based on a minimum expected frequency of the audio signal.

3. The method of claim 1, wherein the step of determining a scaling factor comprising the steps of:

sampling the audio signal to determine peak amplitude within a particular signal segment;

outputting, as the scaling factor, a factor corresponding to a ratio of the peak amplitude and the particular amplitude threshold, when the peak amplitude is greater than the particular amplitude threshold; and outputting a unitary factor as the scaling factor when the peak amplitude is less than the particular amplitude threshold.

4. A method of processing an audio signal to avoid amplifier clipping, comprising the steps of:

generating a zero crossing signal identifying half cycles for the audio signal;

delaying the zero crossing signal for a particular time period;

determining a scaling factor for a particular half cycle of the audio signal based on an amplifier clip avoidance threshold, and peak amplitude of the audio signal within the particular half cycle; and modifying the particular half cycle of the audio signal with the scaling factor using the delayed zero crossing signal when the audio signal has an amplitude peak greater than the amplifier clip avoidance threshold during the particular half cycle.

5. The method of claim 4, wherein the step of generating comprises the step of:

detecting a zero crossing when the audio signal transitions across zero volts; and establishing boundaries for a half cycle of the audio signal based on successive zero crossings.

6. The method of claim 5, wherein the step of determining a scaling factor comprising the steps of:

sampling the audio signal to determine peak amplitude within a particular half cycle;

outputting, as the scaling factor, a factor corresponding to a ratio of the peak amplitude and the amplifier clip avoidance threshold, when the peak amplitude is greater than the amplifier clip avoidance threshold; and outputting a unitary factor as the scaling factor when the peak amplitude is less than the amplifier clip avoidance threshold.

7. An apparatus for processing an audio signal to avoid amplifier clipping, comprising the steps of:

means for generating a transition signal indicating signal segments based on transition points of the audio signal across a particular signal level;

means for delaying the audio signal for a particular delay period to produce a delayed audio signal;

means for delaying the transition signal for the particular delay period to produce a delayed transition signal;

means for generating a scaling factor for each signal segment based on an amplifier clip avoidance threshold signal level, and peak amplitude of the audio signal during each signal segment;

means for storing each scaling factor during the particular delay period; and means for applying scaling factors from the means for storing to corresponding signal segments of the delayed audio signal in response to the delayed transition signal.

8. The apparatus for processing an audio signal, comprising:

a zero crossing detector coupled to the audio signal and having an output of a transition signal identifying segments of the audio signal;

a scaling factor generator coupled to the audio signal and generating a scaling factor for the identified segments of the audio signal based on an amplifier clip avoidance threshold, and peak amplitude of the audio signal within each identified segment;

a scaling module coupled to the audio signal and to the scaling factor generator, the scaling module combining the identified segments of the audio signal with corresponding scaling factors to produce a modified audio signal having no amplitude peaks greater than the amplifier clip avoidance threshold;

a first delay module coupled to the audio signal and having an output of a delayed audio signal with a delay of a particular delay period;

a second delay module coupled to the transition signal and providing a delayed transition signal with a delay of the particular delay period; and a memory module coupled to the scaling factor generator, the memory module being responsive to the transition signal to store each scaling factor;

wherein the memory module outputs a stored scaling factor in response to the delayed transition signal, and the scaling module applies the stored scaling factor to the delayed audio signal to produce the modified audio signal.

9. An apparatus for processing an audio signal, comprising:

a first delay module coupled to the audio signal and having an output of a delayed audio signal with a delay of a particular delay period;

a zero crossing detector coupled to the audio signal and having an output of a transition signal indicating signal segments of the audio signal;

a second delay module coupled to the transition signal and providing a delayed transition signal with a delay of the particular delay period;

a scaling factor generator coupled to the audio signal and to the transition signal, the scaling factor generator outputting a scaling factor for each signal segment based on an amplifier clip avoidance threshold, and peak amplitude of the audio signal within each signal segment;

a memory module coupled to the scaling factor generator, the memory module being responsive to the transition signal to store each scaling factor, and being responsive to the delayed transition signal to output a stored scaling factor; and a scaling module responsive to the delayed audio signal and to the stored scaling factor to produce a modified audio signal having no signal segments with an amplitude peak greater than the amplifier clip avoidance threshold.

* * * * *